United States Patent
Muralimanohar et al.

(10) Patent No.: US 9,443,580 B2
(45) Date of Patent: Sep. 13, 2016

(54) MULTI-LEVEL CELL MEMORY

(75) Inventors: Naveen Muralimanohar, Santa Clara, CA (US); Han Bin Yoon, Pittsburgh, PA (US); Norman Paul Jouppi, Palo Alto, CA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 14/408,512

(22) PCT Filed: Jun. 28, 2012

(86) PCT No.: PCT/US2012/044575
§ 371 (c)(1),
(2), (4) Date: Dec. 16, 2014

(87) PCT Pub. No.: WO2014/003755
PCT Pub. Date: Jan. 3, 2014

(65) Prior Publication Data
US 2015/0162078 A1    Jun. 11, 2015

(51) Int. Cl.
*G11C 7/10* (2006.01)
*G11C 11/56* (2006.01)
*G11C 13/00* (2006.01)
*G11C 16/26* (2006.01)
*G11C 16/06* (2006.01)

(52) U.S. Cl.
CPC ......... *G11C 11/5678* (2013.01); *G11C 7/1057* (2013.01); *G11C 11/56* (2013.01); *G11C 11/5628* (2013.01); *G11C 11/5642* (2013.01); *G11C 13/004* (2013.01); *G11C 13/0004* (2013.01); *G11C 13/0061* (2013.01);
(Continued)

(58) Field of Classification Search
CPC .............. G11C 11/5678; G11C 16/26; G11C 2211/5642; G11C 11/56; G11C 11/5628; G11C 11/5642; G11C 13/0004; G11C 13/004; G11C 13/0061; G11C 13/0069; G11C 16/06

USPC ........... 365/185.03, 185.05, 185.06, 185.11, 365/185.12, 185.17, 185.23, 189.011, 365/189.02, 189.14, 189.15, 189.16, 365/189.05, 196, 230.02
See application file for complete search history.

(56) References Cited

U.S. PATENT DOCUMENTS

| | | | |
|---|---|---|---|
| 2007/0002615 A1 | 1/2007 | Lee | |
| 2008/0112221 A1* | 5/2008 | Park | G11C 11/5628 365/185.03 |

(Continued)

FOREIGN PATENT DOCUMENTS

| | | |
|---|---|---|
| CN | 101202105 | 6/2008 |
| KR | 10-0773400 B1 | 11/2007 |

(Continued)

OTHER PUBLICATIONS

Papandreou et al~"Drift-tolerant Multilevel Phase-change Memory" ~http://regmedia.co.uk/2011/06/30/ibm_phase_change_memory.pdf~2011~pp. 4.

(Continued)

*Primary Examiner* — Fernando Hidalgo
(74) *Attorney, Agent, or Firm* — Dickinson Wright

(57) ABSTRACT

A multi-level cell memory includes a memory cell that stores two or more bits of information; a sensing circuit coupled to the memory cell; and a row buffer structure comprising a split page buffer having a first page buffer and a second page buffer. The sensing circuit operates to read from the memory cell, places a first bit in one of the first page buffer and the second page buffer, and places the second bit in one of the first page buffer and the second page buffer.

14 Claims, 10 Drawing Sheets

(52) U.S. Cl.
CPC ........... *G11C13/0069* (2013.01); *G11C 16/06* (2013.01); *G11C 16/26* (2013.01); *G11C 2211/5642* (2013.01)

(56) References Cited

U.S. PATENT DOCUMENTS

| | | |
|---|---|---|
| 2009/0040836 A1 | 2/2009 | Lee |
| 2009/0196102 A1 | 8/2009 | Kim |
| 2010/0214849 A1 | 8/2010 | Jin et al. |
| 2011/0122685 A1 | 5/2011 | Kang et al. |
| 2011/0155993 A1 | 6/2011 | Chen et al. |
| 2012/0069657 A1 | 3/2012 | Choi et al. |

FOREIGN PATENT DOCUMENTS

| | | |
|---|---|---|
| KR | 2008-0038932 | 5/2008 |
| TW | I253082 | 4/2006 |
| TW | 200849255 A | 12/2008 |

OTHER PUBLICATIONS

PCT Search Report~Application No. PCT/US2012/044575 dated Jan. 31, 2013~10 pages.

Wang et al~"Energy-efficient multi-level cell phase-change memory system with data encoding"~http://ieeexplore.ieee.org/stamp/stamp.jsp~2012~8 pages.

Zhou et al~"Fine-grained QoS Scheduling for PCM-basad Main Memory Systemes"~http://www.cs.pitt.edu/-18 zhangyt/research/ipdps10.pdf~2010~12 pages.

Hanbin Yoon et al, Data Mapping for Higher Performance and Energy Efficiency in Multi-Level Phase Change Memory, Retrieved Feb. 12, 2016, 2 Pages.

Hanbin Yoon et al, Data Mappint for Higher Performance and Energy Efficiency in Multi-Level Phase Change Memory, Retrieved Feb. 12, 2016, 24 Pages.

\* cited by examiner

MULTI-LEVEL CELL MEMORY

BACKGROUND

A computer memory device includes arrays of memory cells and peripheral input and output (I/O) circuitry. In the array, the memory cells are arranged into rows and columns. All memory cells in each row are connected to a common word line. All memory cells in each column are connected to a common bit line. Data throughput is increased by accessing all the memory cells in a row simultaneously using the word line and transmitting data to and from the memory cells using the bit lines.

On the I/O side, data signals from the bit lines are detected by sense amplifiers and latched (stored) in peripheral circuitry known as a row buffer. Once the row's data are placed in the row buffer, subsequent requests to the same row can be serviced by accessing the data in the row buffer. Such an access is known as a row buffer hit, and can be serviced at the latency of the peripheral circuitry, without interacting with the memory cell array. To service an access request for another row, data must be accessed from the memory cell array. This access request, which will result in the contents of the row buffer being replaced, is known as a row buffer miss, and it will incur a longer latency and higher energy consumption than a row buffer hit.

Phase change memory (PCM) is a non-volatile random-access memory technology that may replace or be used in conjunction with dynamic random access memory. One specific implementation of PCM technology stores information by varying the electrical resistance of a material known as chalcogenide. Chalcogenide is a term that refers to the Group VI elements of the periodic table. PCM exploits a behavior of chalcogenide, where heat produced by the passage of an electric current through the chaicogenide switches this material between two states, crystalline and amorphous. The state of chalcogenide is retained in the absence of electrical power. Furthermore, chalcogenide can be manipulated to (e.g., two) additional distinct states, in effect increasing (e.g., doubling) the storage capacity of chalcogenide-based memory.

DESCRIPTION OF THE DRAWINGS

The detailed description will refer to the following drawings in which like numerals refer to like items, and in which.

DETAILED DESCRIPTION

Figure 1:
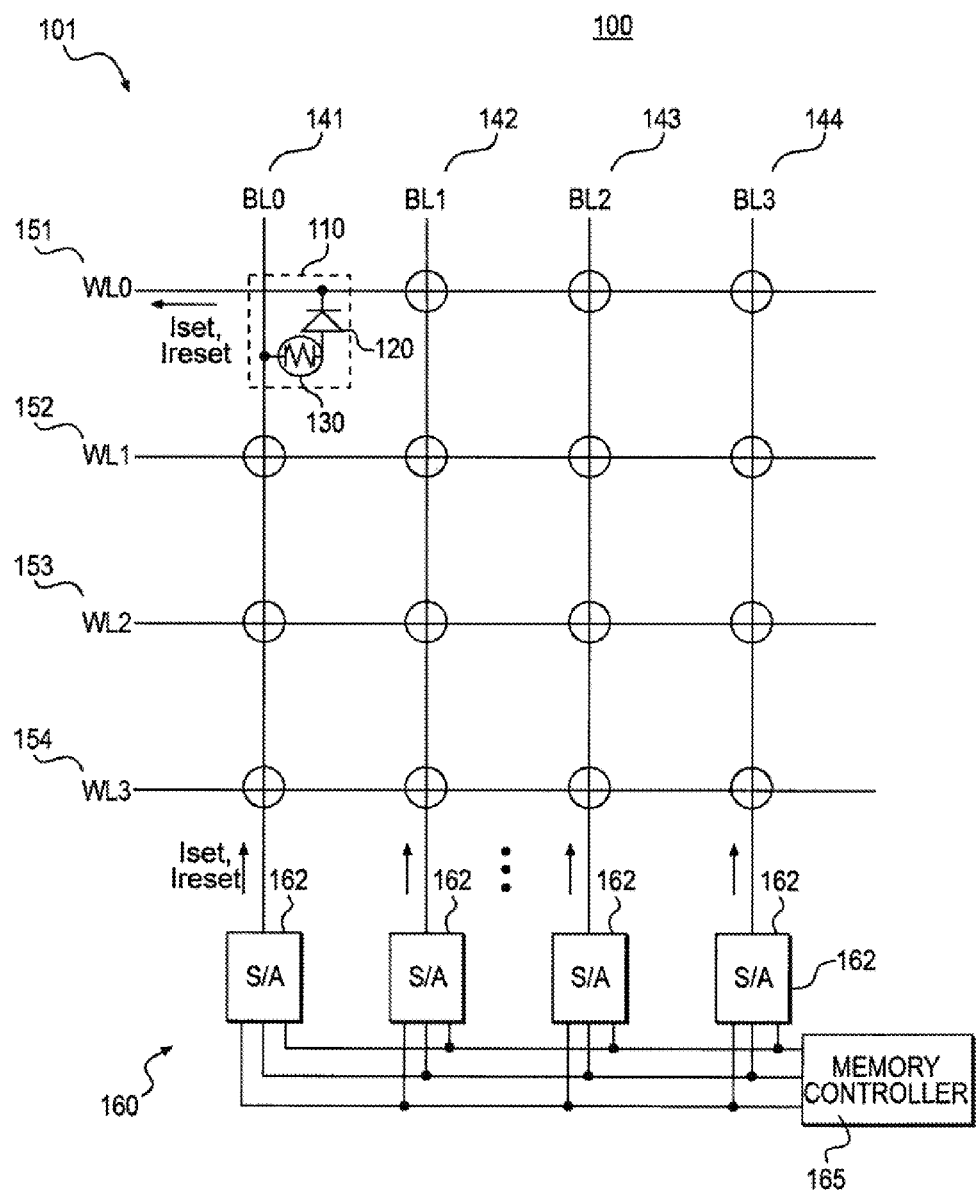
FIG. 1 illustrates an embodiment of a multi-level memory that incorporates split page buffering.

A memory technology enables the storage of information by creating discernable changes in a physical state to represent distinct symbols. Traditionally, memory cells each stored one bit of information. More recently, multi-level cell (MLC) memory devices have been developed and can store two or more bits per memory cell. MLC memory is realized by manipulating a parameter to represent multiple symbols. In MLC memory devices with two bits in a memory cell, a "11" "01", "10", and "00" encoding scheme is possible.

Phase change memory (PCM) is a non-volatile solid state memory that can satisfy the needs for a random access memory as well as mass data storage. PCM uses the unique behavior of a phase change material such as chalcogenide glass, which can be switched between two states, i.e., a crystalline state and an amorphous state. In the amorphous state the phase change material has a high resistance. In the crystalline state the phase change material has a low resistance. Since, in the crystalline and amorphous states, the phase change material has different electrical resistivity, this physical property can be used to store data. The amorphous state, which has a high resistance, can be used to represent a logical zero, while the crystalline, low resistance state can be used to represent a logical one.

A phase change memory cell can be programmed to include more than two different resistance levels. A PCM memory cell can, for example, be programmed to have four different levels of resistance spanning the range, for example, from 10 k ohms to 10 M ohms. The low resistance level of 10 k ohms could correspond to two logical bits 11, the next resistance level of 100 k ohms could represent two logical bits 10, the next higher resistance level of, for example, 1 M ohms could represent a logical bit combination of 01, and the highest resistance level of 10 M ohms could represent logical bits 00. Accordingly, a PCM memory cell can form a multi-level phase change memory cell having multiple resistance levels to store more than one bit in a single memory cell. The capability of multi-level phase change memory cells for storing multiple bits in one cell increases the effective storage density of a PCM. Each of the resistance levels or states can have different physical properties that can be measured during read operations.

Thus, MLC PCM offers higher density and lower cost per bit than SLC (single-level cell, capable of storing one bit per cell) PCRAM. However, MLC PCM also has disadvantages, most notably long latency for certain operations involving reading from and writing to memory, energy consumption, and endurance. However, the latency problems can be ameliorated.

A traditional view of memory, such as RAM, is of a flat monolithic structure with a fixed access latency. To reduce access latency, memory is split into multiple equal-sized units called banks. For example, some memory chips may have 8 to 16 banks. Each bank stores tens of thousands of pages.

A memory bank can only service one request at a time. Any other accesses to the same bank must wait for the previous access to complete. Each memory bank may have one row-buffer, a structure that provides access to a page that is open at the bank. Before a memory location can be read, the entire page containing that memory location is opened and read into the row buffer. The page may stay in the row buffer until the page is explicitly closed. If an access to the open page arrives at the bank, the access may be serviced immediately from the row buffer. This scenario is called a row-buffer hit (typically less than ten processor cycles). However, if an access to another row arrives, the current row must be closed and the new row must be opened before the request can be serviced. This is called a row-buffer conflict or a row buffer miss. A row-buffer conflict incurs substantial delay in some memories (for example, 70+ processor cycles).

Row-buffer conflicts can be reduced by increasing spatial locality in the row buffer, such as by making consecutive memory accesses as close to each other as possible. This often implies packing data which is likely to be accessed together in consecutive memory locations.

Disclosed herein are methods and architectures that improve memory performance by decoupling a row buffer in a manner that corresponds to different bits in a memory cell. This decoupling effectively increases the available row buffers in memory without the need for additional latches. Decoupling may provide more flexibility in managing least significant bit (LSB) and most significant bit (MSB) row buffers, which is not possible in a coupled bit scheme. Decoupling memory bits also may speed up reads and writes to MLC memory and reduce the average access time and the queuing delay at the memory controller.

In a herein disclosed bit decoupling scheme involving memory cells holding two bits of information, the two bits of every memory cell in a row are decoupled, and a row buffer is configured to provide two corresponding page buffers. In this decoupled bit scheme, the true physical contents of both pages in a row of a multi-level cell memory may be read and returned on any read operation. Decoupling bits may not require any additional die area and may be implemented with minimal modifications to the control signal and bus organization. Accessing main memory is a two step process: first a row decoder of a bank activates a page and stores the page in a row buffer; second, a column decoder selects a subset of a row and transfers the row subset to the I/O sense amplifiers. With decoupling, during the activation process, an additional control signal decoded by a memory controller from the address notifies the I/O sense-amplifiers whether to retrieve the LSB or MSB. The overhead of this process is negligible since a single signal can be shared by an entire row of sense-amplifiers. Also, since each cell contributes only one bit, pages become half the size, but twice in number. This has a positive side effect of reducing overfetch and improving energy efficiency. To select a cache line from the row buffer, since the number of bits read is the same in both the decoupled and coupled bit schemes, the herein disclosed decoupling scheme reorganizes the multiplexers such that only MSBs or LSBs are selected for each transfer.

In certain multi-level memories, each sensing circuit should have as many latches as the number of bits stored in a cell to faithfully read or store all the bits. In these designs, a read operation to a cell will retrieve all the values and store the values in the latches corresponding to that cell. Similarly when there is a row buffer conflict, all the latches write back values at once.

The herein disclosed method and architecture relax this constraint to provide more flexibility in handling row buffers. Latches corresponding to a column of memory cells then may store values from different cells. In other words, each latch connected to a bit line can store different pages, effectively increasing the number of row buffers and reducing row buffer conflicts.

To address contention or queuing delay at the memory controller, the disclosed system and method use Disparate Page Buffering (DPB) and Associative Page Buffering (APB). Disparate Page Buffering (DPB) eliminates a constraint that only logical pages from the same physical row can occupy the row buffer. In other words, DPB allows a row buffer to hold logical pages from different physical rows.

Associative page buffering (APB) eliminates a constraint that one page buffer is hardwired to only hold LSB bits, while the other page buffer is hardwired to only hold MSB bits. Thus, APB allows any of the two page buffers to hold either the LSB bits or the MSB bits of a row. When replacing the contents of a page buffer after a raw buffer miss, APB makes it possible to evict the least recently used page buffer (out of the two page buffers in a row buffer), instead of having to evict the hardwired page buffer that corresponds to the LSB/MSB distinction. APB also makes it possible to hold two LSB-bit pages from different rows in the row buffer. However, two MSB-bit pages cannot be buffered, as reading an MSB-bit page into a page buffer invalidates the contents of the other page buffer.

A memory device that supports decoupling can directly support disparate page buffering. Depending upon the implementation of the sensing circuit, associative page buffering may use reconfigured bit line multiplexers, such that there are no restrictions on storing only LSB or MSB bits in row buffer latches. The main complexity may be at the memory controller, which tracks different sub-pages within a row buffer. In addition, while scheduling write backs, the memory controller may determine that both LSB and MSB buffers store values from the same row of cells. If not, the memory controller may explicitly schedule a read request.

FIG. 1 is a schematic of an embodiment of a multi-level cell memory in which bit decoupling is implemented. The memory of FIG. 1 is organized into rows and columns. A memory request specifies the address of its data by indicating the row index and the offset of the column within the row from which to start accessing data. Upon a read request, the data content of the specified row is read by sense amplifiers and latched, in peripheral circuitry known as the row buffer. A read, request is then serviced by transmitting the data from the row buffer to an output port. In the case of a write request, the incoming data from the input port is written to the row buffer. Once the data content of a particular row is latched in the row buffer, subsequent memory requests to different columns in the same row can be serviced quickly from the row buffer. Such a memory access is termed a row buffer hit, whereas if a different row is requested and the content of the row buffer needs to be changed, the memory access is termed a row buffer miss. For row buffer hits, only the peripheral circuitry is utilized, and no access is necessary to the underlying memory cell array. Row Buffer Locality (RBL) refers to the reuse of the same row while it is buffered, thus being able to service memory requests efficiently without having to replace the content of the row buffer.

In FIG. 1, the illustrated memory is a multi-level phase change memory (MLC-PCM). However, the MLC-PCM is but an example shown for illustrative purposes, and other memory technologies may implement the herein disclosed decoupled bit scheme. In the memory 100 of FIG. 1, bit decoupling involves separating, or decoupling, the two bits of a two-bit MLC-PCM cell. However, the MLC-PCM memory cells may hold more than two bits of information. As will be described below, such bit decoupling provides flexibility in managing LSB and MSB row buffers, which is not possible in a coupled bit scheme.

In FIG. 1, memory 100 includes a 4×4 array 101 of memory cells 110. Although a 4×4 array is illustrated in FIG. 1, the memory 100 may have a larger array of memory cells. Associated with each of the memory cells 110 is a select device 120 and a memory element 130.

Memory 100 includes column lines 141-144 and row lines 151-154 to select a particular row of memory cells during a write or read operation. Column lines 141-144 and row lines 151-154 also may be referred to as address lines since these lines may be used to address memory cells 110 during programming or reading. Column lines 141-144 also may be referred to as bit lines and row lines 151-154 also may be referred to as word lines.

The memory cells 110 are coupled to I/O circuitry 160, and data signals from the bit lines 141-144 are detected by sense amplifiers 162 and latched in a row buffer (not shown). Memory controller 165 controls read and write operations of the memory array 101.

Reading a cell of the MLC-PCM involves use of an (integrating) analog-to-digital converter to quantize the resistance of the MLC PCM cell to a discrete (2-bit) symbol value. The symbol value may be determined by measuring the number of clock cycles taken for a pre-charged bit line's voltage to drop, and the number of clock cycles depends on the magnitude of the cell resistance the charge has to flow through. Consequently, in the memory 100, read latency is bounded by the time it takes to detect the cell state with the highest resistance (which allows charge to flow at the lowest rate). For N-bit MLC-PCM, this time is $2^N$ clock cycles or more.

However, some information about the cell contents may be discerned before the read operation is completed. For example, at a point that is $(2^N)/2$ cycles after starting a read operation, it is possible to determine the MSB: under the symbol encoding scheme of "11," "10," "01," "00," if the memory cell state is determined by the $(2^N)/2$th cycle, the MSB is a "1." Otherwise, the MSB is a "0" irrespective of the LSB.

Figure 2:
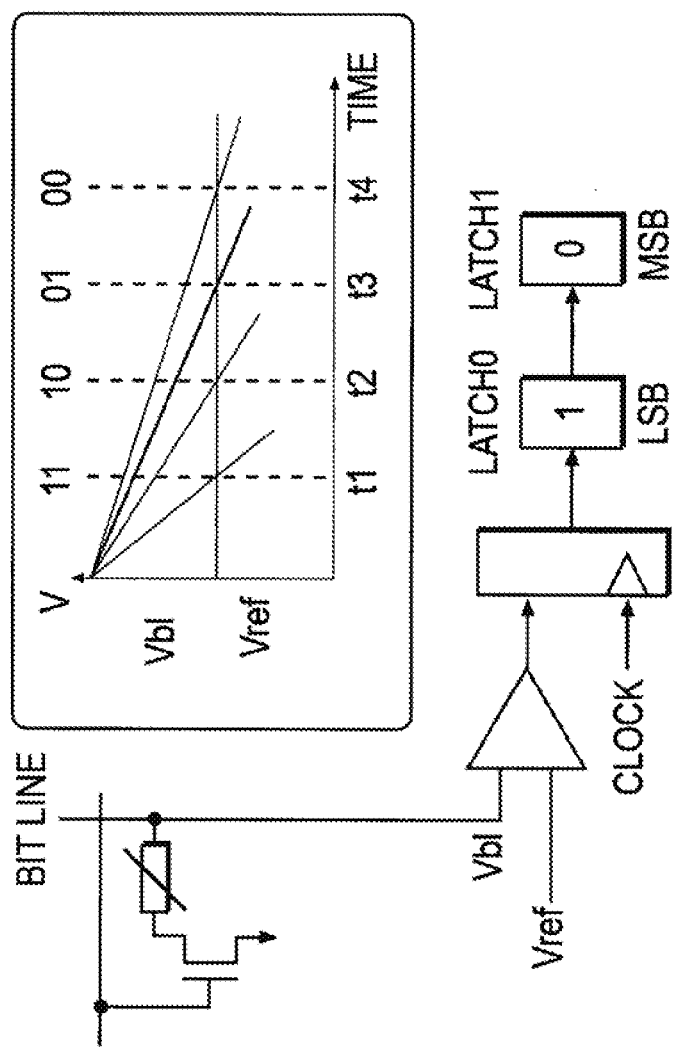
FIG. 2 illustrates an aspect of the multi-level memory of FIG. 1 in more detail.

FIG. 2 illustrates an aspect of the memory of FIG. 1 showing two latches used to buffer the two bits from a cell 110 of the memory 100, specifically a LSB and a MSB. By decoupling the LSB and MSB of a cell and mapping the decoupled bits to separate logical pages, the row buffer associated with the memory array 101 of FIG. 1 can be treated as two page buffers, as will be shown in FIG. 3. In FIG. 2, one of the two latches for every cell in the memory array 101 are grouped together to form a page buffer, in an example, a LSB page buffer. The other latches for every cell are grouped together to form another page buffer, which, in the same example, is a MSB page buffer. Thus, as shown in FIG. 2, bit line 141 for memory cell 110 connects to sense amplifier 162 to provide a signal that may be latched in either a MSB latch or a LSB latch.

Figure 3:
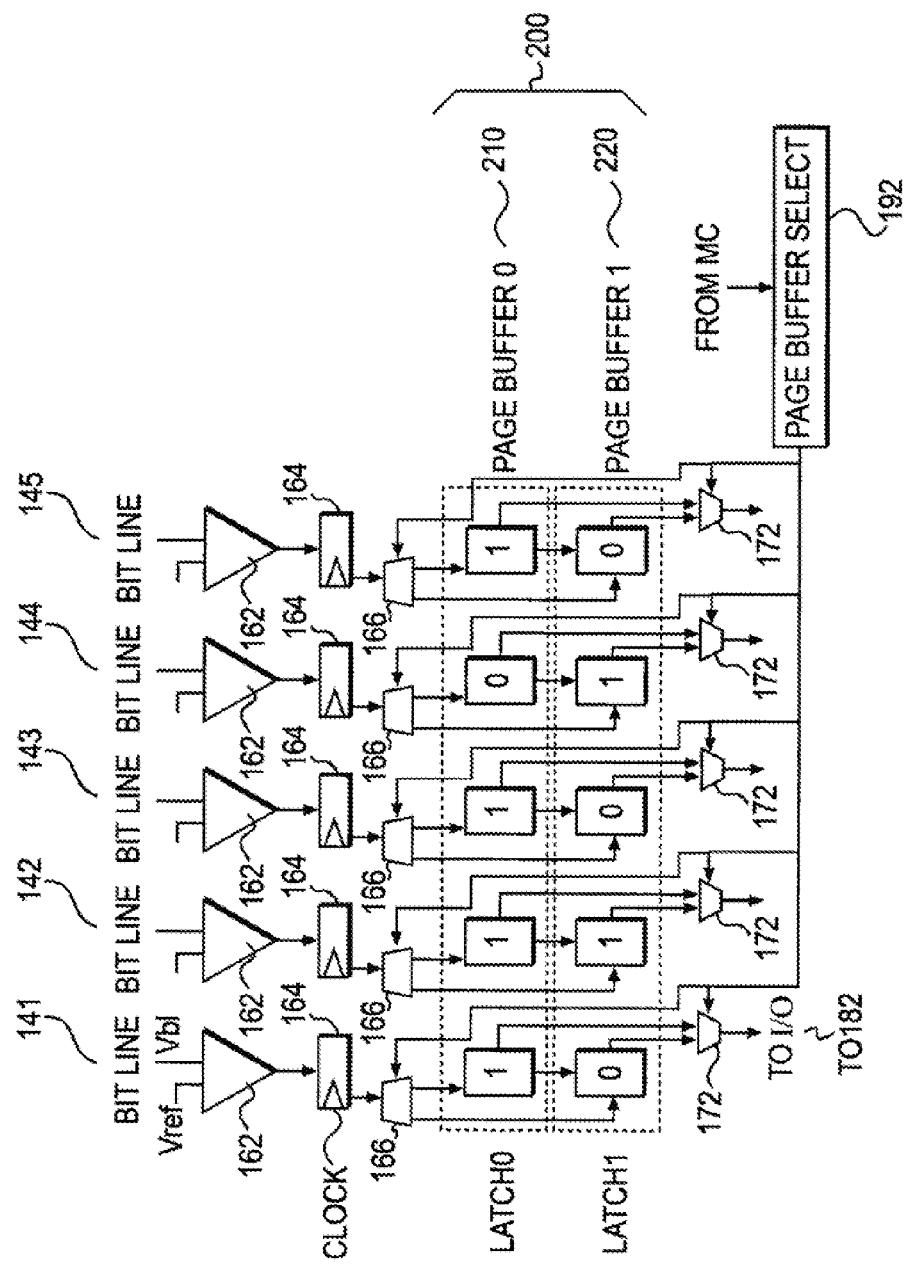
FIG. 3 illustrates an embodiment of a row buffer incorporating spilt page buffering.

FIG. 3 shows a schematic representation of split page buffering as applied to the memory 100 of FIG. 1. In FIG. 3, bit lines 141-145 output data, by way of multiplexers 166, to row buffer 200, which is divided into a page buffer (0) 210 and a page buffer (1) 220. That is, one of the two latches for a memory cell 110 is grouped together with corresponding latches from other memory cells 110 to form the page buffer 210, and the other latches for every cell 110 are grouped together to form the page buffer 220. More specifically, in the illustrated split page buffering scheme, the row buffer 200 is divided along the LSB/MSB dimension and page buffer 210 holds the MSBs and page buffer 220 holds the LSBs. This organization of the row buffer 200 presents an opportunity for an increased Row Buffer Hit Rate (RBHR—the fraction of memory accesses that are row buffer hits) compared to using a single large row buffer, thereby achieving higher performance and energy efficiency. This opportunity is enhanced by using the previously mentioned DPB and APB.

Each bit line 141-145 includes sense amplifier 162, which receives a reference voltage Vref and a bit line voltage Vbl. The sense amplifier 162 connects to a counter 164, which receives a clock signal, clock. When a read operation occurs, the clock counts down until the bit line voltage and the reference voltage are equal. When the bit line voltage decreases (or increases) to the value of the reference voltage, the associated memory cell outputs its symbol value, as determined by the clock signal. The amount of time, as measured by the clock, indicates the resistance level, or symbol value, of the cell. The symbol values are held in the row buffer 200, and more specifically, the MSB may be held in page buffer 0 and the LSB in page buffer 1. Alternately, the LSB may be held in page buffer 0 and the MSB in page buffer 1. In FIG. 3, the MSBs are held in page buffer 1.

Also shown in FIG. 3 are additional hardware components of the memory array, which may be used by memory controller 165 to access the memory cells, and which constitute an example of a mechanism to read out data from the row buffer 200. The additional hardware components include multiplexers 172 that read out the latch 0 and latch 1 values of the page buffer 0 and the page buffer 1. The multiplexers 172 receive a page buffer select signal 192 from the memory controller 165, which determines which of the latch values will be output to I/O circuitry 182. Multiplexers 166 at the inputs to the row buffer 200 also receive the page buffer select signal 192, which determines into which of the latches 210, 220 a value from a memory cell 110 is to be stored. Only one operation, staring a value in the row buffer 200, or reading a value from the row buffer 200, occurs at a time. Thus, depending an the operation, either reading from the row buffer 200 or storing a value in the row buffer 200, the same page buffer select signal 192 determines the flow of values.

Disparate Page Buffering (DPB) eliminates a constraint that only logical pages from the same physical row can occupy the row buffer. In other words, DPB allows the row buffer 200 to hold logical pages (e.g., MSB pages or LSB pages) from different physical rows. With the disclosed architectures and methods, while sensing the LSB can be performed using a single latch (e.g., latch 0), sensing the MSB uses both latches—because the latch holding the LSB must count down the distinct symbols ('11', '10', '01', and '00') of a memory cell for the latch holding the MSB to reach the symbol's MSB value ('11', '10', '01', and '00'). Hence, LSBs can be read into page buffer 210 without affecting the contents of page buffer 220. Reading MSBs into page buffer 220 may cause the contents of the page buffer 210 to be invalidated. The explanation for this occurrence begins with the fact that less time is required to determine the MSB than the LSB. That is, to read the contents of a cell, the sense amplifier 162 compares the signal levels of the bit line and the reference voltage as shown in FIG. 2, and the counter measures the time it takes for the signals to overlap, which, as can be seen in the example of FIG. 2, occurs at time t3, and which produces a symbol value of 01. The MSBs may be read more quickly because the counter counts down in binary format (see FIG. 2). For example at t1, the value is 1-1, t2, the value is 1-0, t3, the value is 0-1, and t4, the value is 0-0. If the countdown stops at or before halfway, the first bit (from 1-1 or 1-0) is a 1. Likewise, if the countdown has not stopped by halfway, then (from 0-1 or 0-0), the first bit must be 0. The reason reading the MSB only invalidates the LSB is because when the MSB is read, the countdown stops when the first bit (i.e., the MSB) is determined. Then, the other bit (i.e., the LSB) is disregarded. Thus, when reading the MSB, by halfway in the countdown, the MSB is known, no further counting is necessary, and the countdown stops.

An exception to this invalidation constraint may occur when the two pages in the page buffers 210 and 220 are from the same row (e.g., both from row 151). In the memory 100 of FIG. 1, the memory controller 165 tracks which rows are read into the row buffer 200, and thus, the memory controller 165 will "know" when the MSB pages and the LSB pages in the page buffers 210 and 220 are from the same physical row of the memory 100. When reading MSB bits into page buffer 220 will invalidate the contents of page buffer 210, the memory controller 165 may execute additional operations, described below. Despite the complexity of these additional operations, being able to buffer two pages from different parts of the memory 100 even with the above-described invalidation constraint may be beneficial because of the reduction in row buffer conflicts that occurs with DPB.

Associative page buffering (APB) eliminates a constraint that one page buffer is hardwired to only hold LSBs, while the other page buffer is hardwired to only hold MSBs. Thus, APB allows any of the two page buffers 210, 220 to hold either the LSBs or the MSBs of a row. When replacing the contents of a page buffer after a row buffer miss, APB makes it possible to evict the least recently used page buffer (out of the two page buffers in a row buffer), instead of having to evict a hardwired page buffer that corresponds to the LSB/MSB distinction. For example, if page buffer 210 (the LSB page buffer) is the least recently used page buffer, and if the memory controller 165 signals reading the MSBs, then under APB, the memory controller 165 will clear the contents of the page buffer 210 rather than the contents of the page buffer 220. In this example, the row buffer 200 will hold two LSB pages. That is, APB makes it possible to hold two LSB pages from different rows in the row buffer 200. However, two MSB pages cannot be buffered, because reading a MSB page into a page buffer, as described above with respect to DPB, invalidates the contents of the other page buffer.

A memory device, such as the memory 100 with its memory controller 165, which supports decoupling may directly support disparate page buffering without any hardware additions. However, depending upon the implementation of the sensing circuit, associative page buffering may use reconfigured bit line multiplexers, such as the multiplexers 166, 172 in FIG. 3, so that there are no restrictions on storing only LSBs or MSBs in the row buffer latches.

Figure 4:
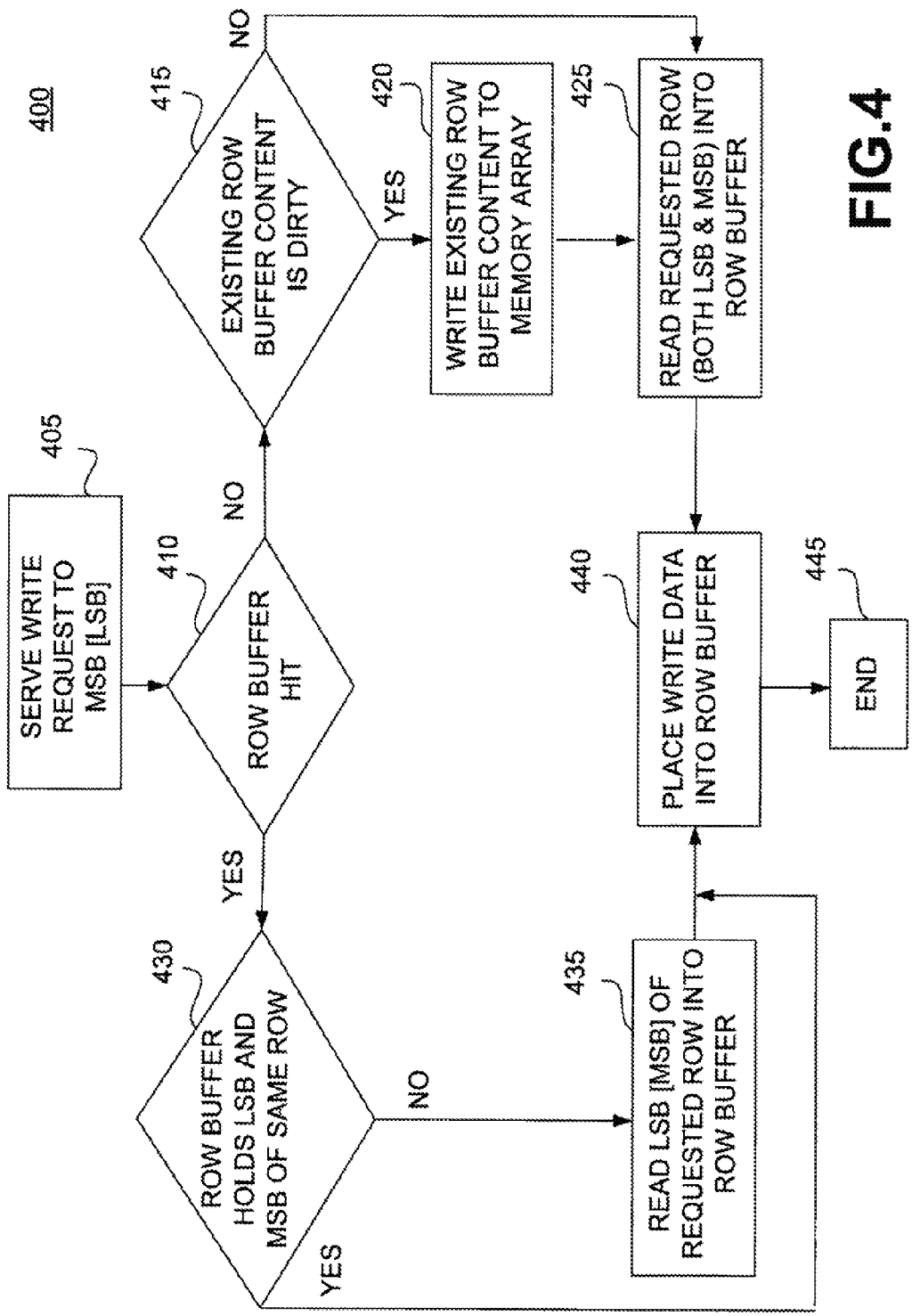
FIGS. 4 and 5 illustrate an embodiment of processes for reading from and writing to memory cells when APB is implemented.
Figure 5:
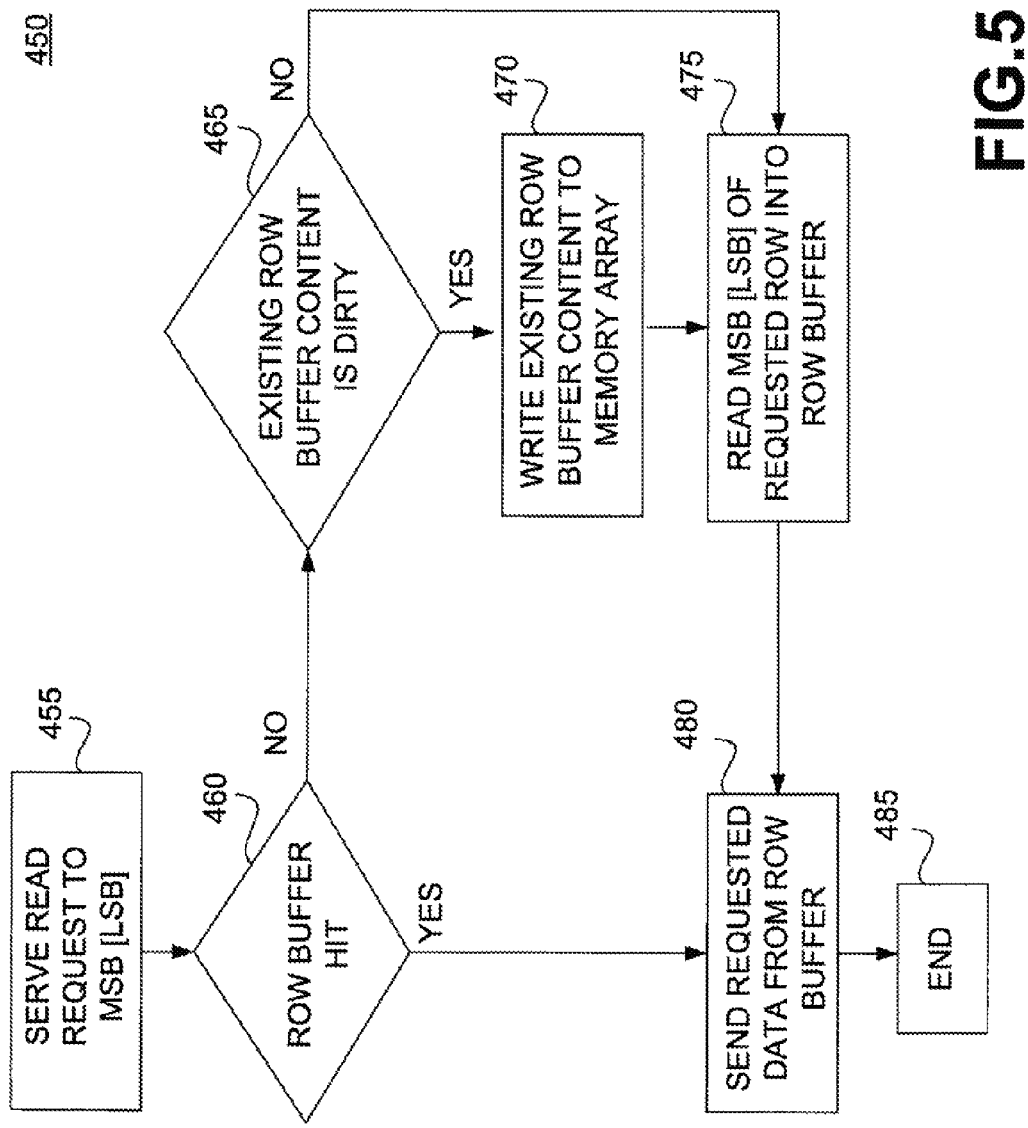

However, disparate/associative page buffering may require changes to read and write requests at the memory controller 165, which tracks the content of different pages (e.g., MSB, LSB) within the row buffer 200. For example, when scheduling writebacks, the memory controller 165 may determine if both LSB and MSB buffers 210 and 220 store values from the same memory row. If the row buffer 200 does not store LSBs and MSBs from the same memory row, the memory controller 165 may explicitly schedule a read request. However, read and write processes become complicated when one of the buffers 210 and 220 holds dirty bits. The complication stems in part from the fact that, as noted with respect to FIG. 2, only one page buffer is needed to read LSBs, but two page buffers are needed to read MSBs. To update the contents of a memory row (a writeback), the row buffer 200 must hold both MSBs and LSBs from the same row. If this condition does not exist at the time the write request is served, the memory controller 165, as noted above, may explicitly schedule a read from the memory row. However, reading bits from a memory row could overwrite dirty bits in the row buffer 200. To avoid this and other related problems, FIGS. 4 and 5 illustrate an embodiments of processes for reading from and writing to memory cells when APB is implemented. The embodiment of FIGS. 4 and 5 guarantees data integrity by avoiding a situation in which a write or read could unintentionally overwrite dirty data. Specifically, the embodiment in FIGS. 4 and 5 ensures that matching LSB and MSB data of the same row are always present in the row buffer when dirty data is brought into the row buffer. FIGS. 6-10 illustrate an alternate embodiment of read and write processes when APB is implemented. The embodiment of FIGS. 6-10 also avoids a situation in which unintended overwriting of dirty data could occur. The embodiment of FIGS. 6-10 ensures that matching LSB and MSB data of the same row are always present in the row buffer when dirty LSB page data is brought into the row buffer.

In FIGS. 4-10, write and read requests are illustrated using the memory arrays of FIG. 1 and the split page buffer arrangement of FIG. 3. For ease of illustration, in the examples of FIGS. 4-10, initial reads and writes are shown as being applied to memory row 151.

FIG. 4 illustrates an example of a write request in the memory system 100 of FIG. 1 in which APB is implemented. In FIG. 4, method 400 begins when a MSB (or LSB) write request is served. If the MSBs are held in the row buffer 200, a row buffer hit occurs, and if the MSBs are not in the row buffer 200, a row buffer miss occurs. See block 410. If, in block 410, a row buffer hit does not occur, the method 400 moves to block 415, and the memory controller 165 determines if the existing row buffer content is dirty. If the existing row buffer content is not dirty, the method 400 moves to block 425. If the row buffer content is dirty, meaning the row buffer 200 holds dirty MSBs from a row other than memory row 151, the method 400 moves to block 420. In block 420, the memory controller 165 directs the contents of the row buffer 200 to be written back to the appropriate memory row. Following block 420, the method 400 moves to block 425. In block 425, the row buffer 200 now is empty, and the memory controller 165 directs a read from memory row 151. The method 400 then moves to block 440.

Returning to block 410, if a row buffer hit occurs, the method 400 moves to block 430. In block 430, the memory controller 165 determines if the row buffer 200 holds LSBs and MSBs of the same memory row, e.g., memory row 151. If the LSBs and MSBs are from row 151, the method 400 moves to block 440. If the MSBs and LSBs are from different rows, the method 400 moves to block 435. In block 435, the memory controller 165 directs a read of the LSBs of row 151 into the row buffer 200, which, as noted above, also reads the MSBs. Note that in block 405, if instead of a MSB write request, a LSB write request was served, in block 435, the memory controller 165 would direct a read of MSBs from row 151. The method 400 then moves to block 440. In block 440, the memory controller 165 directs a write of data from the row buffer 200 to the memory row 151. The method 400 then moves to block 445 and ends.

FIG. 5 illustrates an example of a read request in the memory system 100 of FIG. 1 in which APB is implemented. In FIG. 5, method 450 begins in block 455 with a MSB read request. In block 460, the memory controller 165 determines if a row buffer hit has occurred. If a row buffer miss occurs, the method 450 moves to block 465, and the memory controller 165 determines if existing bits in the row buffer 200 are dirty. If there are no dirty bits, the method 450 moves to block 475. If, however, there are dirty bits in the row buffer 200, the method 450 moves to block 470 and the content of the row buffer 200 is written to the appropriate memory row. The method 450 then moves to block 475. In block 475, the memory controller 165 directs a MSB read from row 151. Note that in block 455, if instead of a MSB read request being served, a LSB read request was served, in block 475, the LSBs of row 151 would be read into the row buffer 200. Following block 475, the method 450 moves to block 480.

Returning to block 460, if a row buffer hit occurs, the method 450 moves to block 480. In block 480, the requested data is sent from the row buffer 200. The method 450 then ends, block 485.

FIGS. 6-10 illustrate an alternate embodiment of read and write processes when APB is implemented in the memory 100 of FIG. 1 with the row buffer structure of FIG. 3. In the example processes, initial read and write requests are illustrated as being applied to memory row 151.

Figure 6:
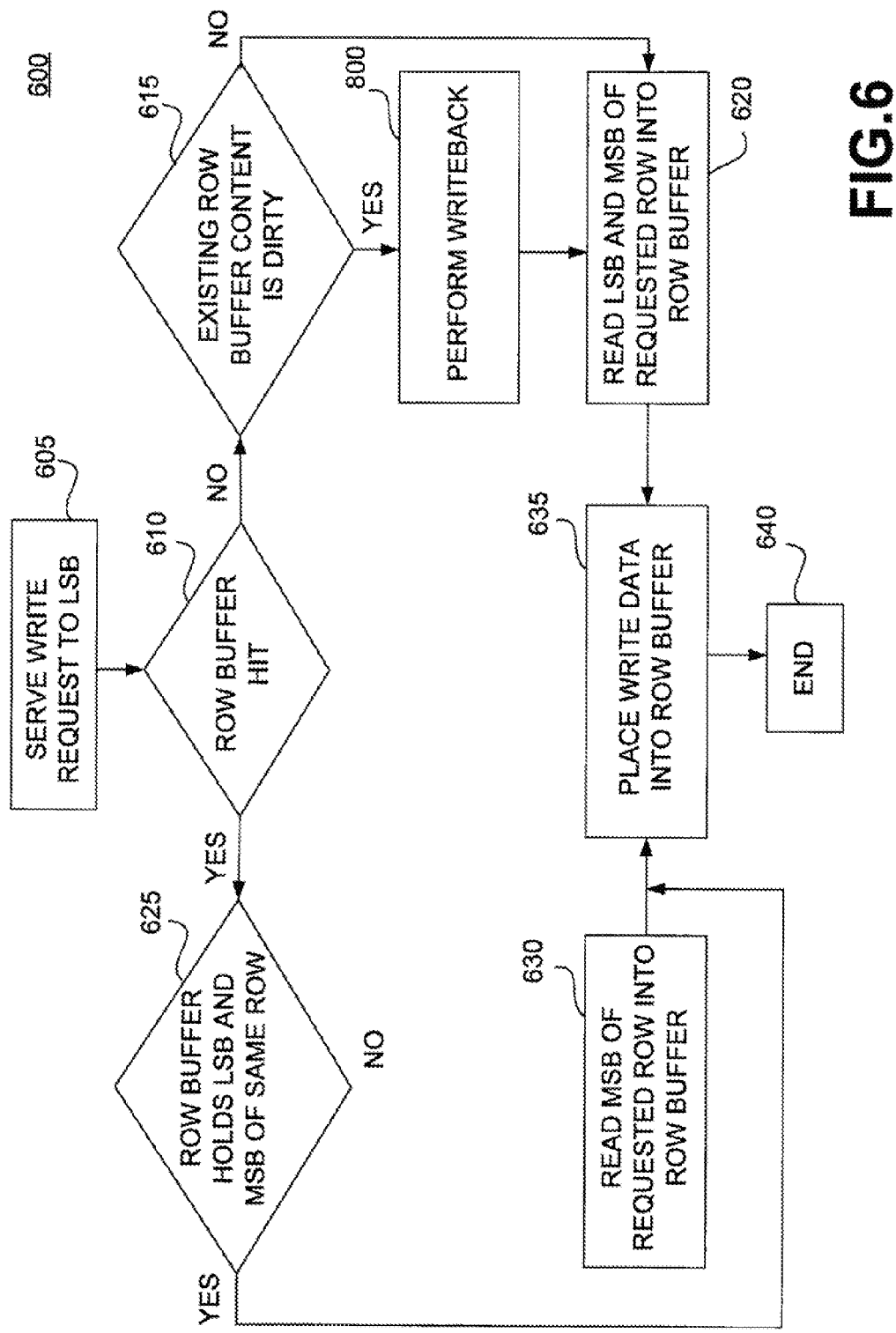
FIGS. 6-10 illustrate an alternate embodiment of read and write processes when associative page buffering is implemented.
Figure 10:
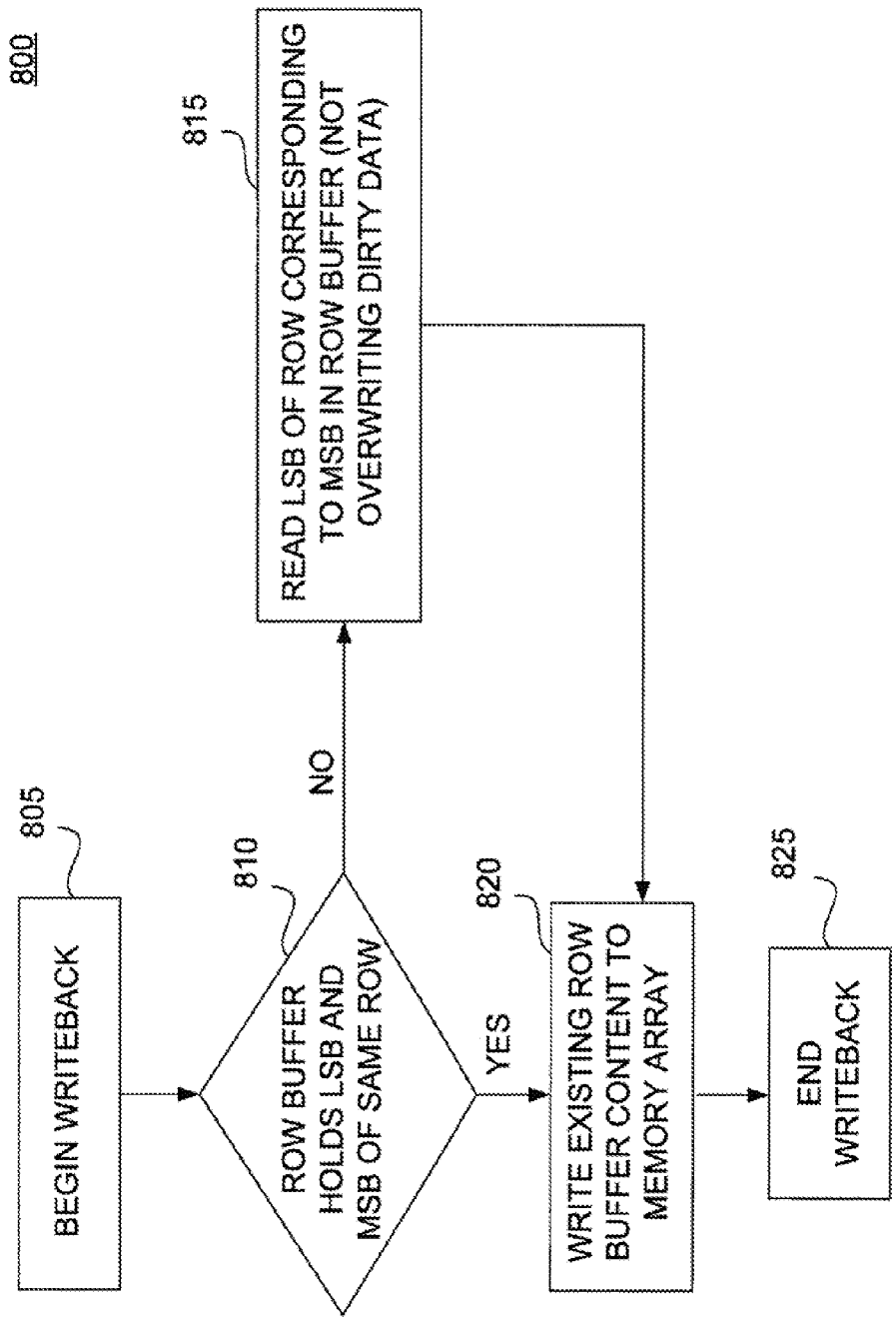

FIG. 6 illustrates LSB write method 600, which begins in block 605 when a LSB write request is served on the memory controller 165. In block 610, the memory controller 165 determines if a row buffer hit occurs, which means the page buffer 210 holds the LSBs for memory row 151. In block 610, it there is no row buffer hit, the LSBs for row 151 are not held in the page buffer 210. In that case, the method 600 moves to block 615, and the memory controller 165 determines if the existing row buffer content is dirty. If the existing row buffer content is not dirty, then the LSBs and MSBs in the row buffer 200 may be overwritten without loss of data. Accordingly, the method 600 moves to block 620 and the memory controller 165 directs that the LSBs and MSBs of row 151 are read into the row buffer 200. However, if in block 615, the existing row buffer content is dirty, the method 600 moves to block 800, and the memory controller 165 directs the contents of the row buffer 200 be written back to the memory array 100. FIG. 10 illustrates the writeback process of block 800.

Returning to block 610, if there is a row buffer hit upon serving the LSB write request, the method 600 moves to block 625, and the memory controller 165 determines if the row buffer 200 holds LSBs and MSBs from the same row (in the example, LSBs and MSBs from memory row 151). If the row buffer holds LSBs and MSBs from row 151, the method 600 moves to block 635. However, if the row buffer 200 does not hold LSBs and MSBs from row 151, the method 600 moves to block 630. In block 630, the memory controller 165 directs the reading of MSBs from row 151 into row buffer 200, and more specifically into page buffer 220. Following block 630 processes, the method 600 moves to block 635. In block 635, the memory controller writes the LSBs from row 151 into the row buffer 200, and specifically into the page buffer 210. The method 600 then moves to block 640 and ends.

Figure 7:
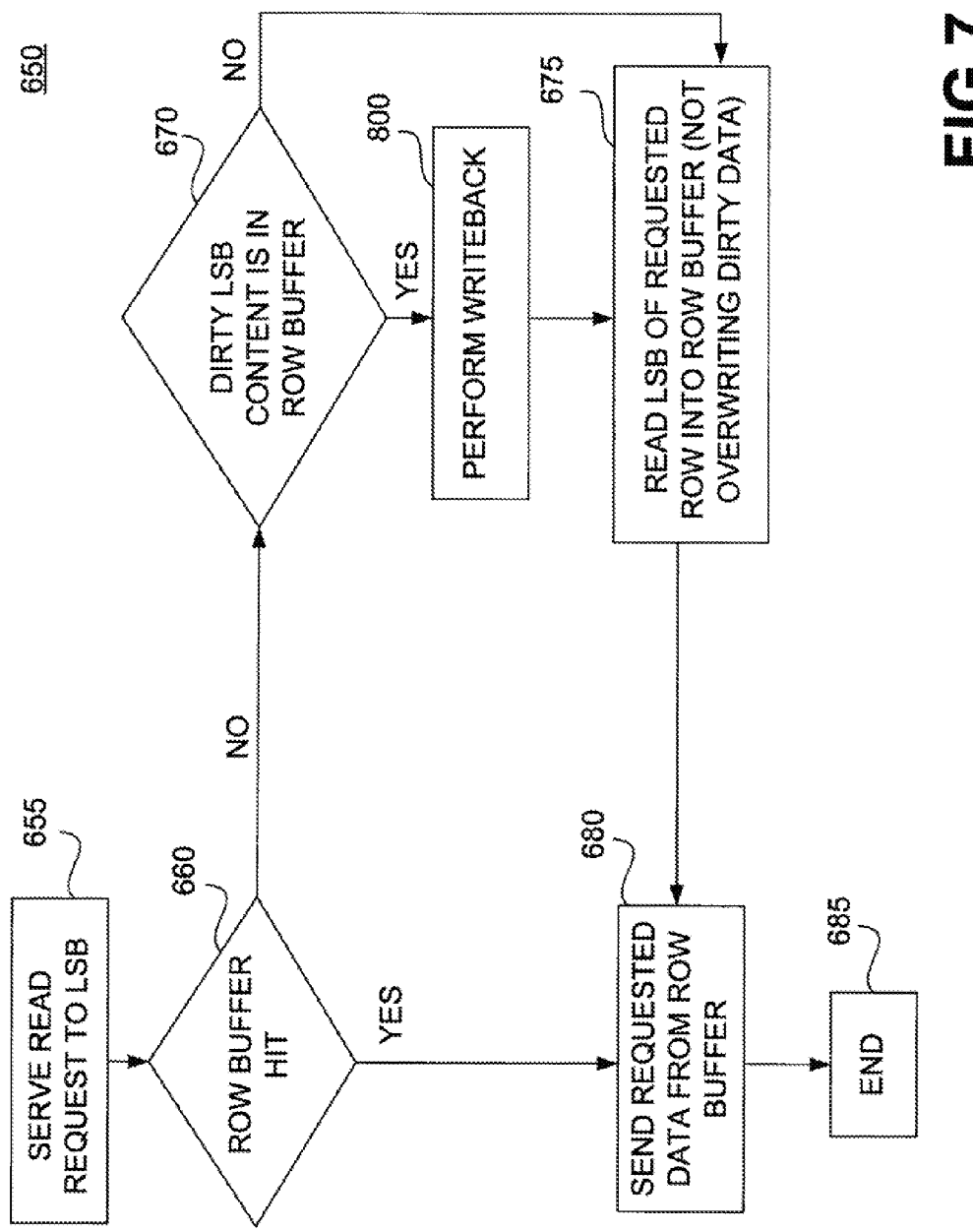

FIG. 7 illustrates an example LSB read process. In FIG. 7, LSB read method 650 begins in block 655 when the memory controller 165 is served a LSB read request to read the LSBs in memory row 151. In block 660, the memory controller 165 determines if there is a row buffer hit, meaning the LSBs for row 151 already are held in the row buffer 200. In there is no row buffer hit, the method 650 moves to block 670. In block 670, the memory controller 165 determines if the row buffer 200 holds dirty LSBs. If the row buffer 200 does not hold dirty LSBs, the method 650 moves to block 675. However, if the row buffer 200 holds dirty LSBs, the method 650 moves to block 800, and the memory controller 165 directs a writeback process, which is shown in detail in FIG. 10. Following block 800, the method 650 moves to block 675. In block 675, the LSBs of row 151 are read into the row buffer 200. Following block 675, the method 650 moves to block 680.

Returning to block 660, if there is a row buffer hit, the method 650 moves to block 680. In block 680, the requested data is sent from the row buffer 200. The method 650 then moves to block 685 and ends.

Figure 8:
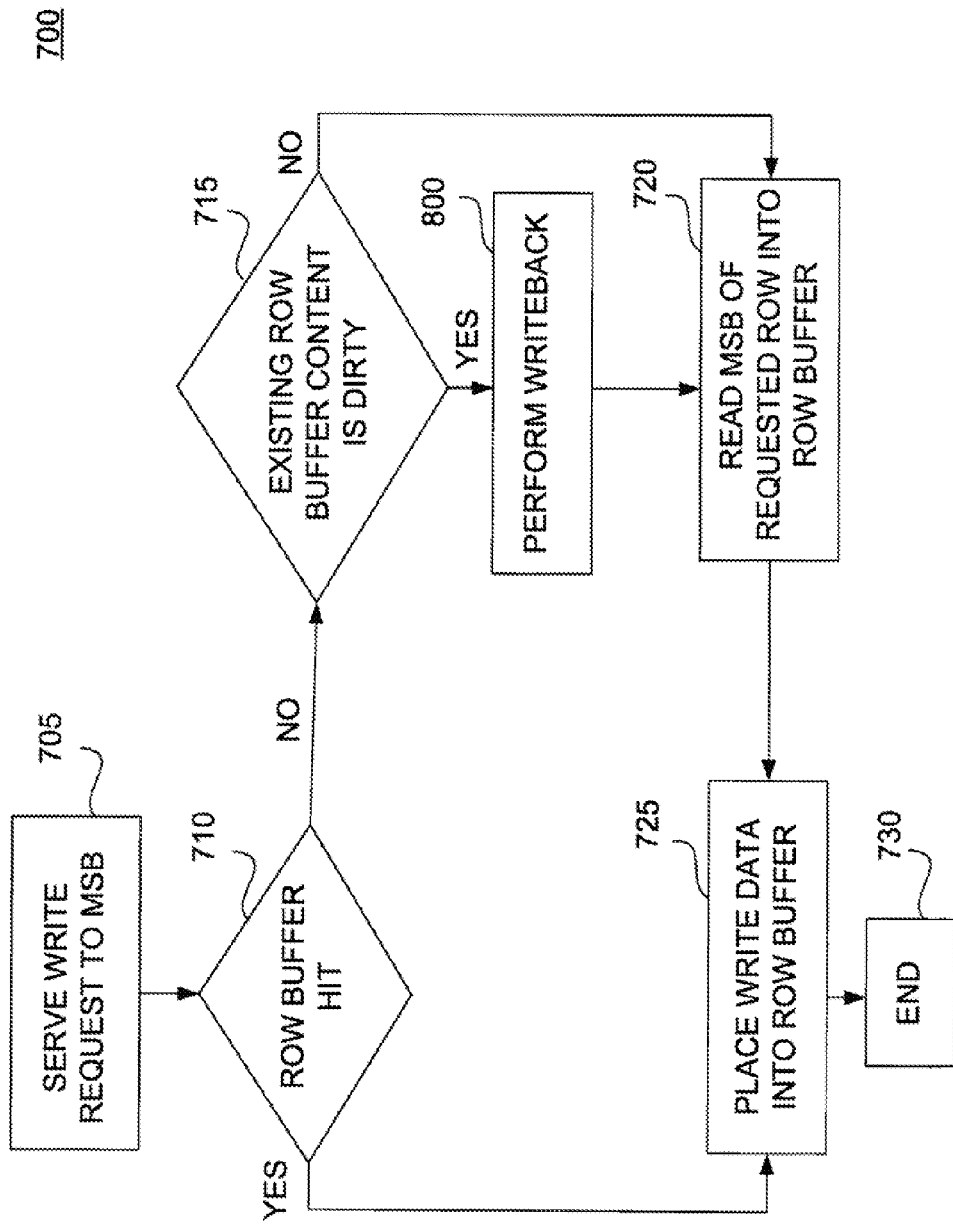

FIG. 8 illustrates an example MSB write process. In FIG. 7, MSB write method 700 begins in block 705 when the memory controller 165 is served a MSB write request. The memory controller 165 first determines if a row buffer hit condition exists, block 710. If there is no row buffer hit, the method 700 moves to block 715, and the memory controller 165 determines if the existing row buffer content is dirty. If the existing row buffer content is not dirty, the method 700 moves to block 720. However, if the existing row buffer content is dirty, the method 700 moves to block 800. In block 800, the memory controller 165 directs a writeback process, which is shown in detail in FIG. 10. The method 700 then moves to block 720. In block 720, the memory controller 165 directs a read of the MSBs of row 151 into the row buffer 200. Then, the method 700 moves to block 725.

Returning to block 710, if a row buffer hit occurs, the method 700 moves to block 725. In block 725, the memory controller 165 directs writing data to the row buffer 200. The method 700 then moves to block 730 and ends.

Figure 9:
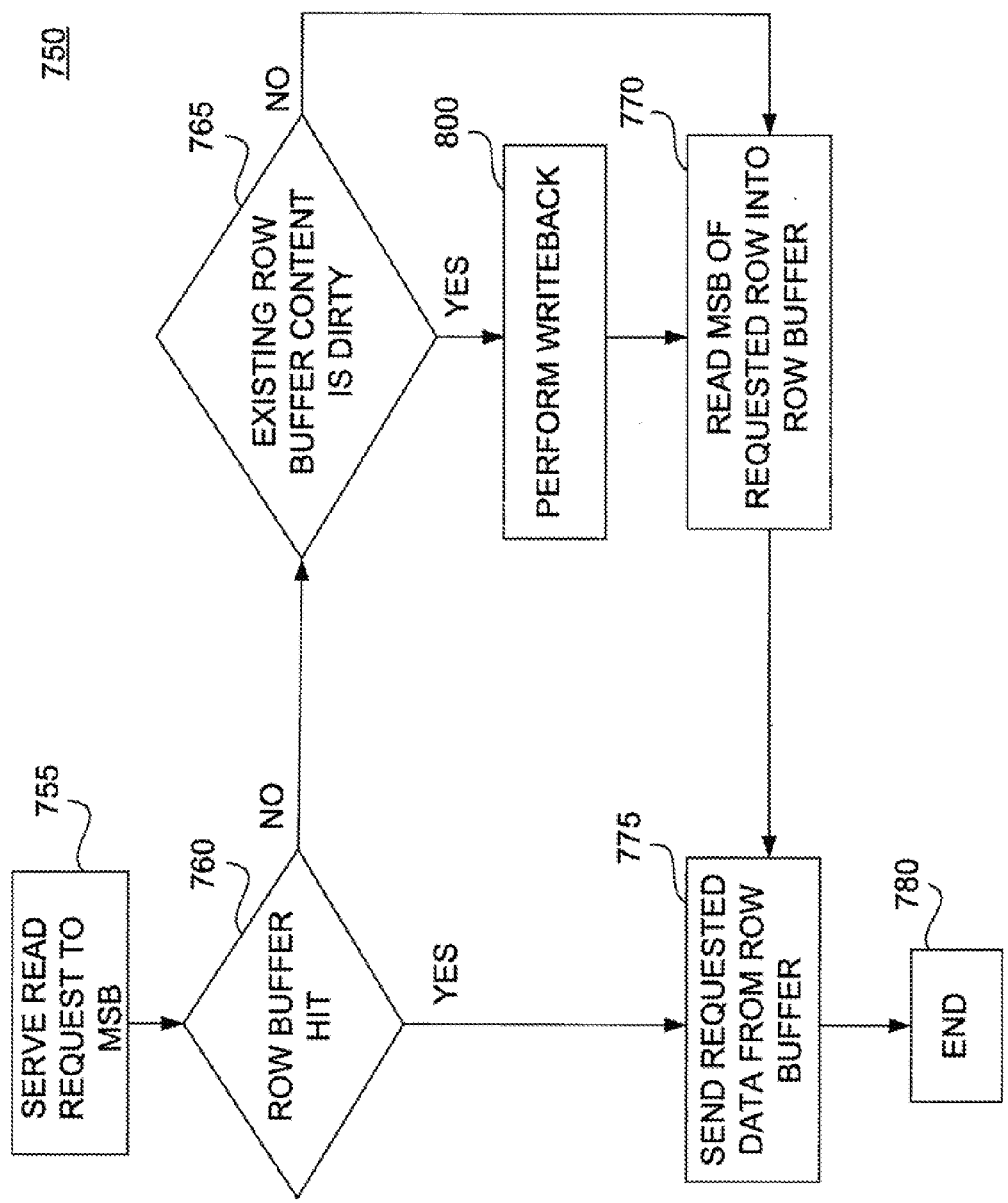

FIG. 9 illustrates an example MSB read process in which a request to read the MSBs of memory row 151 is served. In FIG. 9, method 750 begins in block 755 with a MSB read request for memory row 151. In block 760, the memory controller 165 determines if there is a row buffer hit. In there is no row buffer hit, the method 750 moves to block 765. In block 765, the memory controller 165 determines if the existing content of row buffer 200 dirty. If the row buffer 200 does not hold dirty bits, the method 750 moves to block 770. However, if the row buffer 200 holds dirty bits, the method 750 moves to block 800, and the memory controller 165 directs a writeback process, which is shown in detail in FIG. 10. Following block 800, the method 750 moves to block 770. In block 770, the MSBs of raw 151 are read into the row buffer 200. Following block 770 the method 750 moves to block 775.

Returning to block 760, if there is no row buffer hit, the method 750 moves to block 775. In block 775, the request data is sent from the row buffer 200. The method 750 then moves to block 780 and ends.

FIG. 10 illustrates an example of a write back process. In FIG. 10, write back method 800 begins in block 805 after the memory controller 165, in a read or write process, determines some content of the row buffer 200 is dirty (see blocks 615, 670, 715, and 765 of FIGS. 6-9, respectively). In block 810, the memory controller 165 determines if the row buffer 200 holds LSBs and MSBs of the same memory row. If the row buffer 200 does not hold LSBs and MSBs of the same memory row, the method 800 moves to block 815, and the memory controller 165 directs a read of LSBs of the memory row corresponding to the MSBs in the row buffer 200. This operation will not overwrite any dirty data because if a LSB page is (or both the matching LSB and MSB pages are) dirty, the matching MSB page must already be buffered in the row buffer 200, and the method 800 will proceed to block 820. If, however, only the MSB page is buffered and dirty, the other latch array of the row buffer 200 may be holding a clean LSB page that is from a memory row different from the memory row of the dirty, buffered MSB page. This later condition may exist, and in such a case, to write back the dirty MSB page, its matching LSB page can be read into the row buffer 200 using a single array of latches (one page buffer as opposed to two page buffers). Thus, the read operation of block 815 will not overwrite any dirty bits.

Following either block 810 or 815, the method 800 moves to block 820. In block 820, the existing row buffer content is written to the memory array. The method 800 then moves to block 825 and ends.

Thus, FIGS. 4 and 5 illustrate one embodiment for read write processes in a memory implementing APB, and FIGS. 6-10 illustrate another embodiment. While both embodiments will provide read and write operations without loss or corruption of data, the embodiment of FIGS. 6-10 has the potential benefit of being able to increase the degree to which pages from different memory rows are buffered, thereby increasing row buffer hit rate. However, the same embodiment may increase the worst-case delay of serving a read or write request. This is because to perform a writeback from the row buffer to the memory array, the row buffer contents now have to be checked to ensure that they are from the same row, and if the row buffer contents are not from the same row, then an additional read from the array (to have matching LSB and MSB pages in the row buffer) is made. By contrast in the embodiment of FIGS. 4 and 5 the LSB and MSB pages are restricted to be of the same row whenever there is dirty data in the row buffer.

We claim:

1. A multi-level cell memory comprising:
    a memory cell that stores two or more bits of information;
    a sensing circuit coupled to the memory cell, wherein the sensing circuit operates to read from the memory cell, the sensing circuit to compare a reference voltage to a bit line voltage and determine a number of clock cycles elapsed until the reference voltage and bit line voltage are equal, wherein the value of the two or more bits is based on the number of elapsed clock cycles; and
    a row buffer structure comprising a split page buffer having a first page buffer and a second page buffer, wherein the sensing circuit places a first bit in one of the first page buffer and the second page buffer, and wherein the sensing circuit places the second bit in one of the first page buffer and the second page buffer.

2. The memory of claim 1, wherein the row buffer is split into two logical pages in the least significant bit/most significant bit direction.

3. The memory of claim 2, wherein the logical pages from a first physical row of memory and the logical pages from a second physical row of memory are held in the first page buffer.

4. The memory of claim 1, wherein the first bit is a LSB bit and the second bit is a MSB bit, and wherein the LSB bit is placed in the first page buffer and the MSB bit is placed in the second page buffer.

5. The memory of claim 1, wherein the first bit is a LSB bit from a first physical row and the second bit is a LSB bit from a second physical row, and wherein the first LSB bit and the second LSB bit are placed in a same page buffer.

6. The memory of claim 1, wherein the first and the second bits are mapped to separate logical pages.

7. The memory of claim 1, wherein one of two latches for the memory cell is grouped with one of two latches for other memory cells of the memory to form the first page buffer and another of the two latches for the memory cell is grouped with another of two latches for other memory cells to form the second page buffer.

8. The memory of claim 1, wherein the row buffer structure further comprises:
    row buffer input multiplexers that are used to select one of the first bit and the second bit to store in the split page buffer;
    row buffer output multiplexers that are used to select one of the first page buffer and the second page buffer; and
    a page buffer select signal that determines the operation of the input and output buffers.

9. A multi-level cell memory, comprising:
    a plurality of multi level cells, each cell holding a plurality of information bits;
    a sensing circuit coupled to each of the plurality of multi level cells, wherein the sensing circuit operates to read from the multi level cell, the sensing circuit to compare a reference voltage to a bit line voltage and determine a number of clock cycles elapsed until the reference voltage and bit line voltage are equal, wherein the value of the plurality of information bits is based on the number of elapsed clock cycles;
    a row buffer coupled to the cells, comprising:
        a first page buffer that latches a first information bit from each of the plurality of multi level cells, and
        a plurality of additional page buffers, each of the additional page buffers latching one of an additional information bit from each of the plurality of multi level cells; and
    a peripheral circuit that selects one of the first page buffer and the additional page buffers to latch information bits.

10. The multi level cell memory of claim 9, wherein the peripheral circuit comprises multiplexers coupled to a latch of the first page buffer and a latch of each of the additional page buffers, the memory further comprising a memory controller, wherein the memory controller comprises a page buffer select signal circuit that specifies which latch to select; and wherein the page buffers hold information bits from different rows of the multi level cell memory.

11. A method for buffering a multi-level cell memory, comprising:
    receiving an access request for a requested row of the memory, wherein the memory comprises a row buffer, and the row buffer comprises a first page buffer and a second page buffer;
    determining if a row buffer hit occurs; and
    if a row buffer hit occurs, completing the access request; wherein
    when the access is a MSB write request and the row buffer hit does not occur, the method further comprising:
        determining if existing content of the row buffer is dirty, wherein:
            if the existing row buffer content is not dirty, the method comprises reading LSBs and MSBs of a requested row into the row buffer, and wherein:
            if the existing row buffer content is dirty, the method comprises:
                writing the existing row buffer content to the memory array; and
                reading the LSBs and MSBs of the requested row into the row buffer.

12. The method of claim 11, wherein when the access is a MSB write request and the row buffer hit occurs, the method further comprising:
    determining if the row buffer holds LSBs and MSBs of a same row, wherein:
        if the row buffer does not hold LSBs and MSBs of the same row, the method comprises:

reading the LSBs of the requested row into the row buffer, and writing data into the row buffer; and wherein:

if the row buffer holds LSBs and MSBs of the same row, the method comprises writing data into the row buffer.

13. The method of claim 11, wherein when the access is a LSB write request and the row buffer hit does not occur, the method further comprising:

determining if existing content of the row buffer is dirty, wherein:

if the existing content of the row buffer is dirty, the method comprises:

writing the existing content into the memory;

reading the LSBs and MSBs of the requested row into the row buffer; and placing write data into the row buffer, and wherein:

if the existing content of the row buffer is not dirty, the method comprises:

reading the LSBs and MSBs of the requested row into the row buffer; and placing write data into the row buffer.

14. The method of claim 13, wherein writing the existing content into memory comprises:

determining if the row buffer holds the LSBs and MSBs of a same row;

If the row buffer does not hold the LSBs and MSBs of the same row:

reading LSBs of a row corresponding to a row of the MSBs in the row buffer, and writing existing contents of the row buffer to the memory; and if the row buffer holds the LSBs and MSBs of the same row:

writing the existing contents of the row buffer to the memory.

* * * * *

UNITED STATES PATENT AND TRADEMARK OFFICE
CERTIFICATE OF CORRECTION

| | | |
|---|---|---|
| PATENT NO. | : 9,443,580 B2 | Page 1 of 1 |
| APPLICATION NO. | : 14/408512 | |
| DATED | : September 13, 2016 | |
| INVENTOR(S) | : Naveen Muralimanohar | |

It is certified that error appears in the above-identified patent and that said Letters Patent is hereby corrected as shown below:

In the Specification

Column 1, Line 4, insert the following:
--STATEMENT OF GOVERNMENT RIGHTS
This invention was made with Government support under Contract No. DE-SC0005026 awarded by the Department of Energy. The Government has certain rights in this invention.--

Signed and Sealed this
Thirteenth Day of November, 2018

Andrei Iancu
*Director of the United States Patent and Trademark Office*